(12) United States Patent
Yu et al.

(10) Patent No.: US 8,498,105 B2
(45) Date of Patent: Jul. 30, 2013

(54) USB DEVICE STRUCTURE

(75) Inventors: Hong-Chi Yu, Kaohsiung (TW); Mao-Ting Chang, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 368 days.

(21) Appl. No.: 12/926,652

(22) Filed: Dec. 2, 2010

(65) Prior Publication Data
US 2012/0075790 A1   Mar. 29, 2012

(30) Foreign Application Priority Data
Sep. 29, 2010   (TW) .................... 99133117 A (51) Int. Cl.
*G06F 1/16* (2006.01)

(52) U.S. Cl.
USPC .................................................. 361/679.32

(58) Field of Classification Search
USPC .................................................. 361/679.32
See application file for complete search history.

(56) References Cited

U.S. PATENT DOCUMENTS

| | | | |
|---|---|---|---|
| 7,008,240 B1 * | 3/2006 | Wang et al. | 439/76.1 |
| 7,095,617 B1 * | 8/2006 | Ni | 361/736 |
| 8,116,083 B2 * | 2/2012 | Ni et al. | 361/737 |
| 8,194,408 B2 * | 6/2012 | Chou et al. | 361/737 |
| 8,274,796 B2 * | 9/2012 | Kuster | 361/752 |
| 2007/0171620 A1 * | 7/2007 | Lee | 361/737 |
| 2008/0144270 A1 * | 6/2008 | Dal Porto et al. | 361/684 |
| 2008/0232060 A1 * | 9/2008 | Yu et al. | 361/684 |
| 2008/0276099 A1 * | 11/2008 | Nguyen et al. | 713/186 |
| 2009/0190277 A1 * | 7/2009 | Hiew et al. | 361/56 |
| 2010/0008035 A1 * | 1/2010 | Okumura | 361/679.31 |
| 2010/0290180 A1 * | 11/2010 | Huang | 361/679.32 |
| 2010/0290181 A1 * | 11/2010 | Huang | 361/679.32 |
| 2010/0328874 A1 * | 12/2010 | Ko | 361/679.32 |
| 2011/0128712 A1 * | 6/2011 | Prest et al. | 361/783 |

* cited by examiner

*Primary Examiner* — Lisa Lea Edmonds
(74) *Attorney, Agent, or Firm* — Bacon & Thomas, PLLC (57) ABSTRACT

A USB device structure has a memory module and at least one support element. A combined thickness of the memory module and the support element complies with a height of a male connector having at least one data transmission interface of USB, Mini USB, Micro USB and e-SATA. Accordingly, the USB device structure of the present invention can effectively reduce the thickness of a storage device and can be extensively applied to advertisement and promotion and properly stored.

12 Claims, 8 Drawing Sheets

Fig. 1

Prior Art

USB DEVICE STRUCTURE

FIELD OF THE INVENTION

The present invention relates to a USB device structure, and more particularly to a USB device structure capable of being thickened by a stacking means.

BACKGROUND OF THE INVENTION

With the advent of networking era, information sharing speed is accelerated, so is popularization and advancement of information technology. Regardless of the fields of computer, communication and consumer-electronics, diversified products thereof have deeply penetrated into daily life of all walks of life.

Among them, portable data storage devices formed by combining a data transmission interface and non-volatile memory, such as flash memory, are widespread and commonplace nowadays. Besides, keeping abreast with the fast development of fabrication technique in semiconductor industry, devices associated with flash drives, portable external hard disks or other flash memories tend to decrease in size while providing higher portability. The storage capacities of those devices can easily reach the level of Tera bytes, and are still climbing up. As a result, such devices are favored by consumers in terms of the use for data sharing.

As far as flash drives are concerned, each of them is usually equipped with a USB plug (USB device structure) to be plugged in a USB socket of a computer for data access.

However, regular USB device structure has a tiny surface that is inconvenient to be printed with texts and/or graphs thereon. Hence, vendors manufacture USB device structure having the size of a business card so as to enlarge their sizes and facilitate printing and advertising with the enlarged area.

Figure 1:
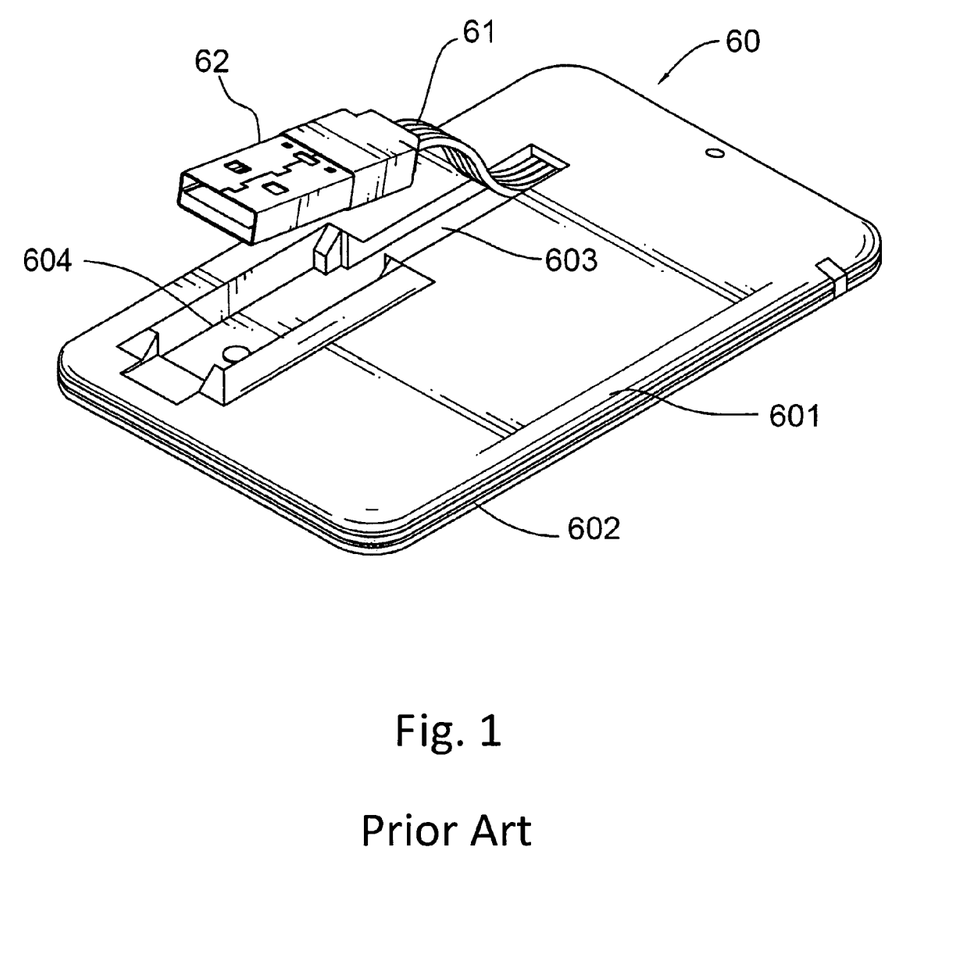
FIG. 1 is a perspective view of a conventional USB device structure.

With reference to FIG. 1, disclosed in Taiwanese Patent Issue Number M328060, a USB device structure has a flat body 60, a memory module mounted inside the body 60, a signal connection line 61 of the memory module and a USB type A male connector 62. The body 60 has a first panel 601 and a second panel 602. The first panel 601 has a cable slot 603 and a plug slot 604. The cable slot 603 is narrow and formed in the first panel 601. The plug slot 604 is rectangular and formed in the first panel, communicates with the cable slot 603, and serves to accommodate the USB type A male connector.

Figure 2A:
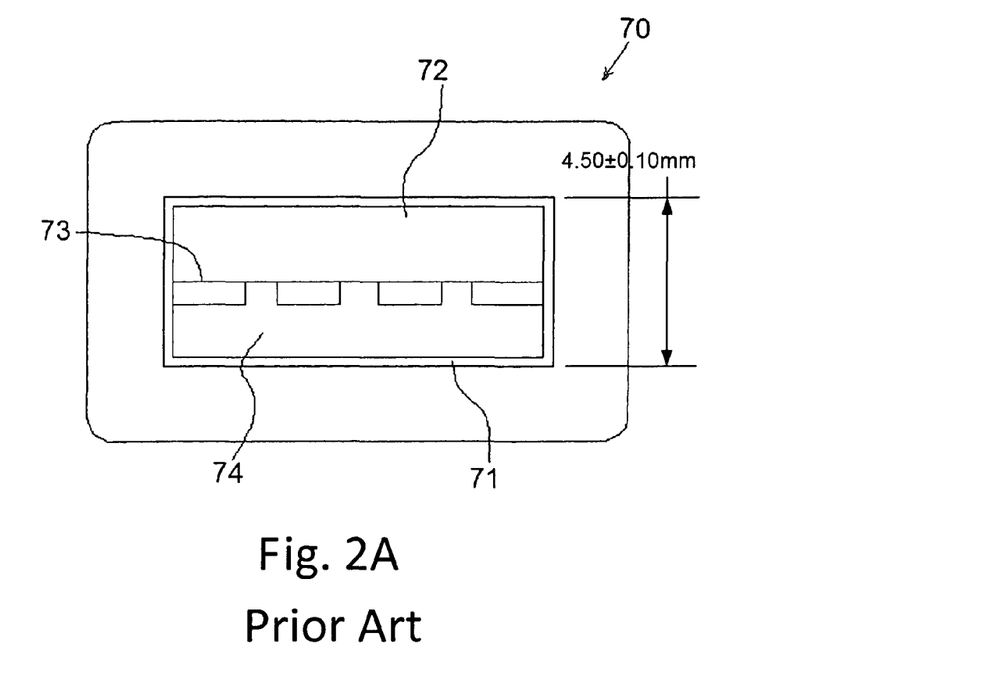
FIG. 2A is a side view in partial section of a USB type A male connector.
Figure 2B:
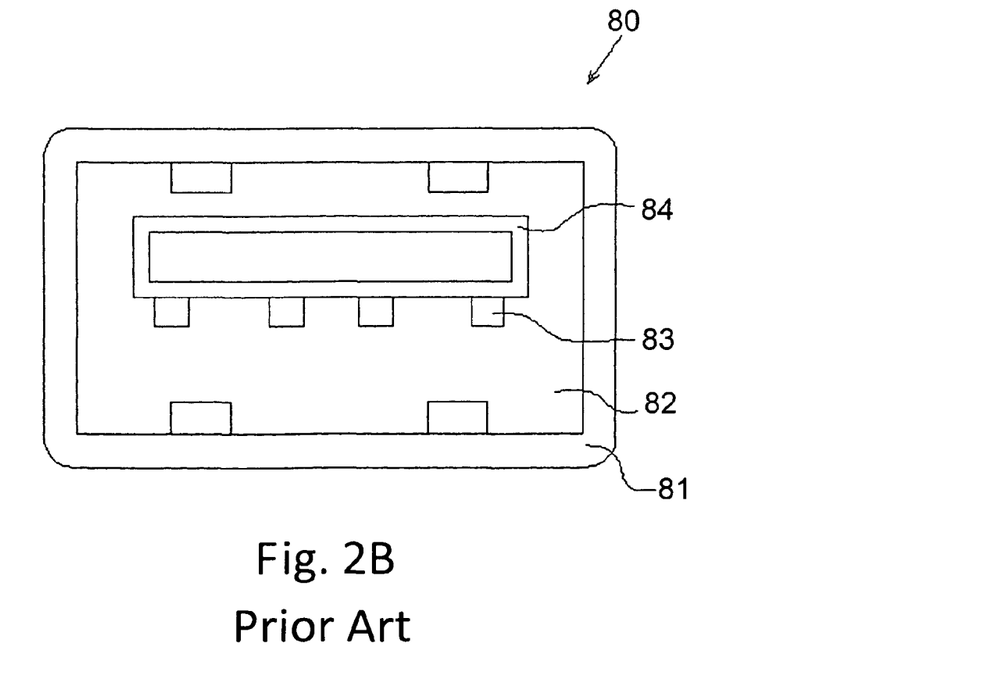
FIG. 2B is a side view in partial section of a USB type A female connector.

Additionally, with reference to FIGS. 2A and 2B, the diagrams are shown in unit of millimeter. In accordance with the standard of a type A connector 70 of USB transmission interface, the thickness of a metal frame 71 of the male connector 70 is 4.5 mm±0.1 mm. A part of the thickness 72 serves to accommodate multiple metal contacts 83 and their bearer 84 of a female connector 80. A thickness 82 inside the female connector 80 serves to accommodate multiple metal contacts 73 and their bearer 74. In other words, a thickness from the bearer 84 of the female connector 80 to an outer frame 81 of the female connector 80 is equal to a minimal thickness of the male connector 70. Accordingly, due to the limitation of the standard specifications, the thickness of the male connector 70 fails to be thinner, thus limiting the applicability of USB device structure.

Although the well-developed fabrication technique of semiconductor industry significantly diminishes the size of memory module and lowers the production cost, limited by the standard specifications of USB connectors, the sizes of USB device structure fail to be thinner and thus limit their applications in the aspects of advertisement and promotion. Likewise, the USB device structure is unable to be applied to credit cards, debit cards, personal ID card (approximately 1.7 to 1.9 mm in thickness), regular business card (approximately 0.3 to 0.5 mm in thickness) or promotion card board (approximately 1.8 to 2.0 mm in thickness). As a consequence, the USB device structure have their limitation in applications to content of merchandise, event propaganda and website navigation.

Moreover, as a result of the thickness issue, the USB device structure are not easy to be properly received within stationeries, a document holders or business card holders having limited space.

SUMMARY OF THE INVENTION

To solve the foregoing problem, the USB device structure has a memory module and at least one support element. A combined thickness of the memory module and the support element complies with a height of a male connector having at least one data transmission interface of USB, Mini USB, Micro USB and e-SATA.

Accordingly, the present invention targets at reducing a thickness of a USB device structure (a data transmission interface combined with non-volatile memory) when the USB device structure is stored so that the present invention can be extensively applied to advertisement and promotion.

Another objective of the present invention is to reduce a thickness of a USB device structure (a data transmission interface combined with non-volatile memory) when the USB device structure is stored so that the present invention can be properly stored.

To achieve the foregoing objective, the USB device structure has at least one support element and a memory module. The memory module has a substrate, at least one memory chip and at least one control component. The substrate has an inner surface, an outer surface and multiple metal contacts. The metal contacts are mounted on the outer surface. The at least one memory chip is mounted on the inner surface of the substrate. The at least one control component is mounted on the inner surface of the substrate. A combined thickness of the memory module and the support element complies with a height of a male connector having at least one data transmission interface of USB, Mini USB, Micro USB and e-SATA.

The objectives and technical solutions of the present invention can be further implemented by the following technical approaches.

Preferably, the USB device structure comprises one support element, the memory module has at least one protrusion formed on and protruding from an outer surface of the memory module, the support element has at least one recess formed in a corresponding outer surface of the support element, each of the at least one protrusion of the memory module corresponds to and engages a corresponding recess of the support element.

Preferably, the USB device structure comprises one support element, the memory module has at least one recess formed in an outer surface of the memory module, the support element has at least one recess formed on and protruding from a corresponding outer surface of the support element, and each of the at least one recess of the memory module corresponds to and engages a corresponding protrusion of the support element.

Preferably, the USB device structure comprises one support element, and further comprises an adhesive layer mounted between an outer surface of the memory module and a corresponding surface of the support element to bond the memory module with the support element.

Preferably, the USB device structure comprises one support element, and further comprises magnetic materials respectively mounted on an outer surface of the memory module and on a corresponding outer surface of the support element to attract the memory module and the support element together.

Preferably, a thickness of the memory module is no larger than 1.3 mm.

Preferably, the memory module further has a package formed on the inner surface of the substrate for packaging the at least one memory chip and the at least one control chip in the package.

Preferably, the metal contacts are compatible with at least one of USB, Mini USB, Micro USB and e-SATA data transmission interfaces of a male connector.

Preferably, the USB device structure further comprises a housing, and the memory module and the support element are mounted in the housing.

Preferably, the USB device further comprises a bearer having a bearer slot, and the housing is mounted in the bearer slot of the bearer.

Preferably, the housing has at least one rib, each of the at least one rib is longitudinally formed across a corresponding outer surface of the housing, the bearer has at least one channel, and each of the at least one channel is formed in a corresponding inner wall of the bearing slot of the bearer so that each of the at least one rib of the housing is mounted in a corresponding channel of the bearing slot of the bearer.

Preferably, the housing and the bearer are made of plastic, paper board, metal, and a combination of plastic, paper board and metal.

In contrast to conventional technique, the present invention can effectively reduce the thickness of a storage device and can be extensively applied to advertisement and promotion and properly stored.

The foregoing and other features and advantages of the present invention will be more clearly understood through the following descriptions with reference to the drawing, wherein:

DETAILED DESCRIPTION OF THE PREFERRED EMBODIMENT

It is to be noted that the following descriptions of preferred embodiments of this invention are presented herein for purpose of illustration and description only; it is not intended to be exhaustive or to be limited to the precise form disclosed.

Figure 3:
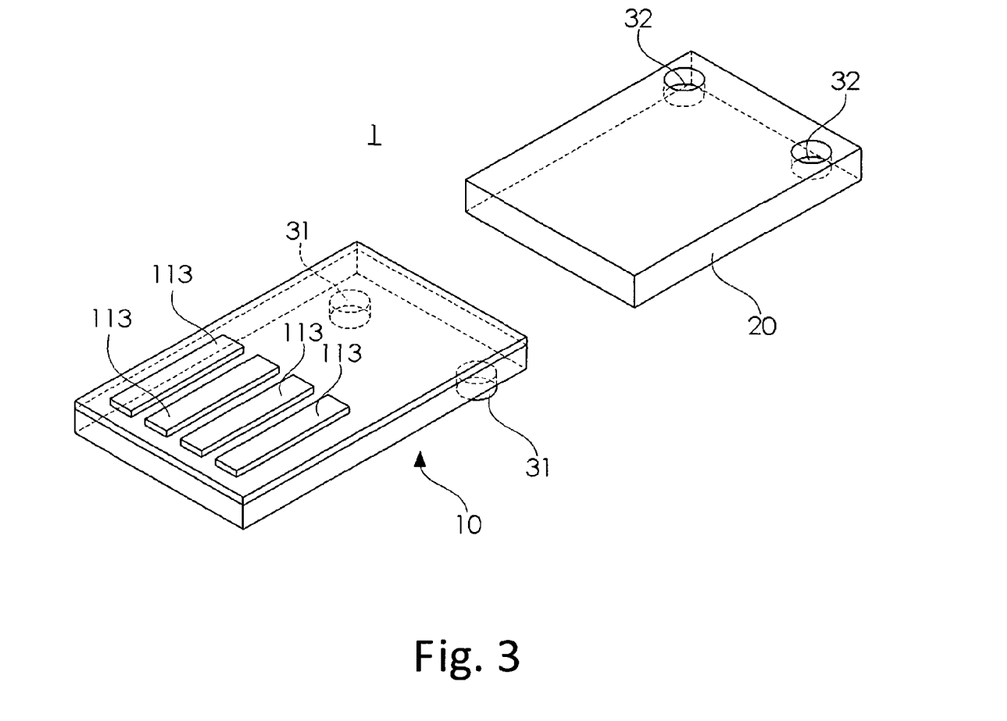
FIG. 3 is an exploded perspective view of a first embodiment of a USB device structure in accordance with the present invention.
Figure 4:
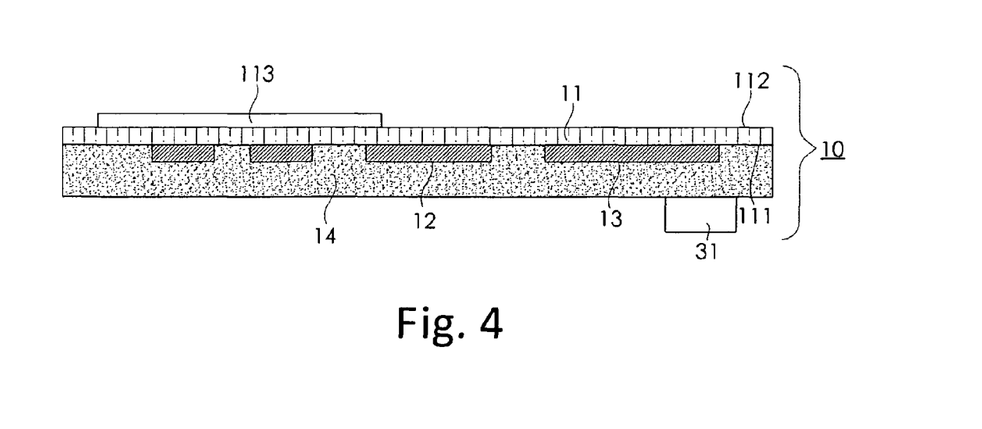
FIG. 4 is an enlarged front view in partial section of the USB device structure in FIG. 3.
Figure 5:
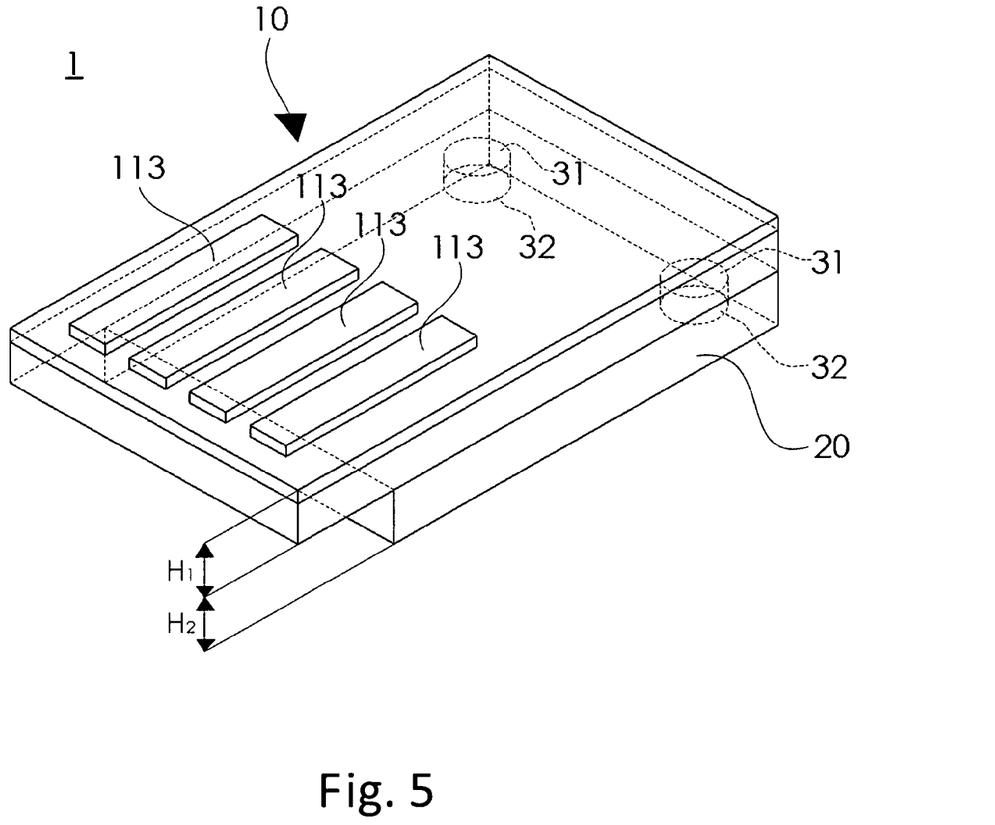
FIG. 5 is a perspective view of the USB device structure in FIG. 3.

With reference to FIGS. 3 to 5, a first embodiment of a USB device structure in accordance with the present invention has a memory module 10 and a support element 20. The memory module 10 may be a Chip-on-board (COB) package, and has a substrate 11, at least one memory chip 12, at least one control component 13 and a package 14. The substrate 11 has an inner surface 111, an outer surface 112 and a plurality of metal contacts 113. The metal contacts 113 are mounted on the outer surface 112.

Specifically, the metal contacts 113 are compatible with at least one of USB, Mini USB, Micro USB and e-SATA data transmission interfaces of a male connector. In the present embodiment, the metal contacts 113 are described in accordance with a USB type A data transmission interface of a male connector.

Besides, the at least one memory chip 12 and at least one control component 13 are mounted on the inner surface 111 of the substrate 11 to electrically connect to the inner surface 111 of the substrate 11 by wires (not shown) formed by wire bonding or flip chip bonding technique.

Specifically, the substrate 11 is normally a high-density plated through multi-layer printed circuit board (PCB) and has circuits (not shown) formed therein to serve as electrical transmission paths so that the metal contacts 113 are electrically connected with the at least one memory chip 12 and the at least one control component 13 through the substrate 11.

Besides, the at least one memory chip 12 may be a flash memory, a static random access memory (SRAM), an application-specific integrated circuit (ASIC), a synchronous dynamic random access memory (SDRAM) or the like.

Preferably, the package 14 is formed on the inner surface 111 of the substrate for packaging the at least one memory chip 12 and the at least one control chip 13 therein. Passive components (not shown) required by the USB device structure 1 may be mounted on the inner surface 111 and are mounted in the package 14.

With reference to FIGS. 3, 4 and 5, the memory module 10 is stacked on the support element 20 to provide a combined thickness in compliance with the minimum height of a male connector having at least one of USB, Mini USB, Micro USB and e-SATA data transmission interface. In the present embodiment, a male connector having a USB type A data transmission interface is adopted. Hence, the thickness (H1) of the memory module 10 is no larger than 1.3 mm.

Preferably, the memory module 10 has at least one protrusion/recess 31 formed on and protruding from or formed in an outer surface of the memory module 10. The support element 20 has at least one recess/protrusion 32 formed in or formed on and protruding from an outer surface of the support element 20. Each of the at least one protrusion/recess 31 of the memory module 10 corresponds to and engages a corresponding recess/protrusion 32 so that the memory module 10 can be firmly stacked on the support element 20. Alternatively, an adhesive layer (not shown) is mounted between an outer surface of the memory module 10 and a corresponding outer surface of the support element 20 so as to bond the memory module 10 and the support element 20 together. An outer surface of the memory module 10 and a corresponding outer surface of the support element 20 are respectively attached with magnetic materials (not shown) so that the memory module 10 and the support element 20 are attracted together by magnetic force. Therefore, the present invention is not limited to how the memory module 10 is combined with the support element 20. It is the protection scope of the present invention as long as the combined thickness of the memory module 10 and the support element 20 is smaller than a minimum height of a male connector having any data transmission interface.

The present invention includes but not limited to the first embodiment described by correspondingly combining the memory module 10 and the second support element 20.

Figure 6:
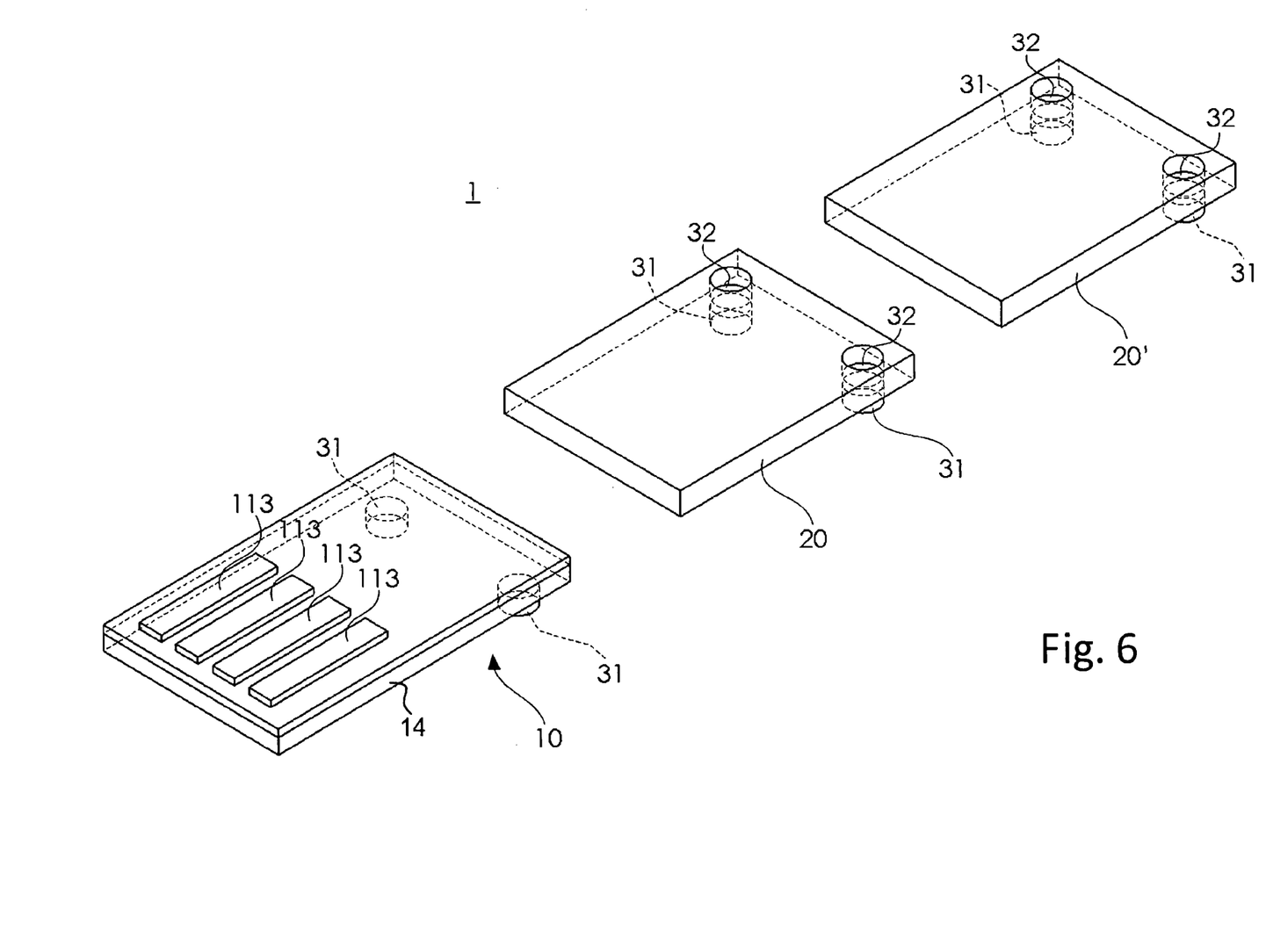
FIG. 6 is an exploded perspective view of a second embodiment of a USB device structure in accordance with the present invention.
Figure 7:
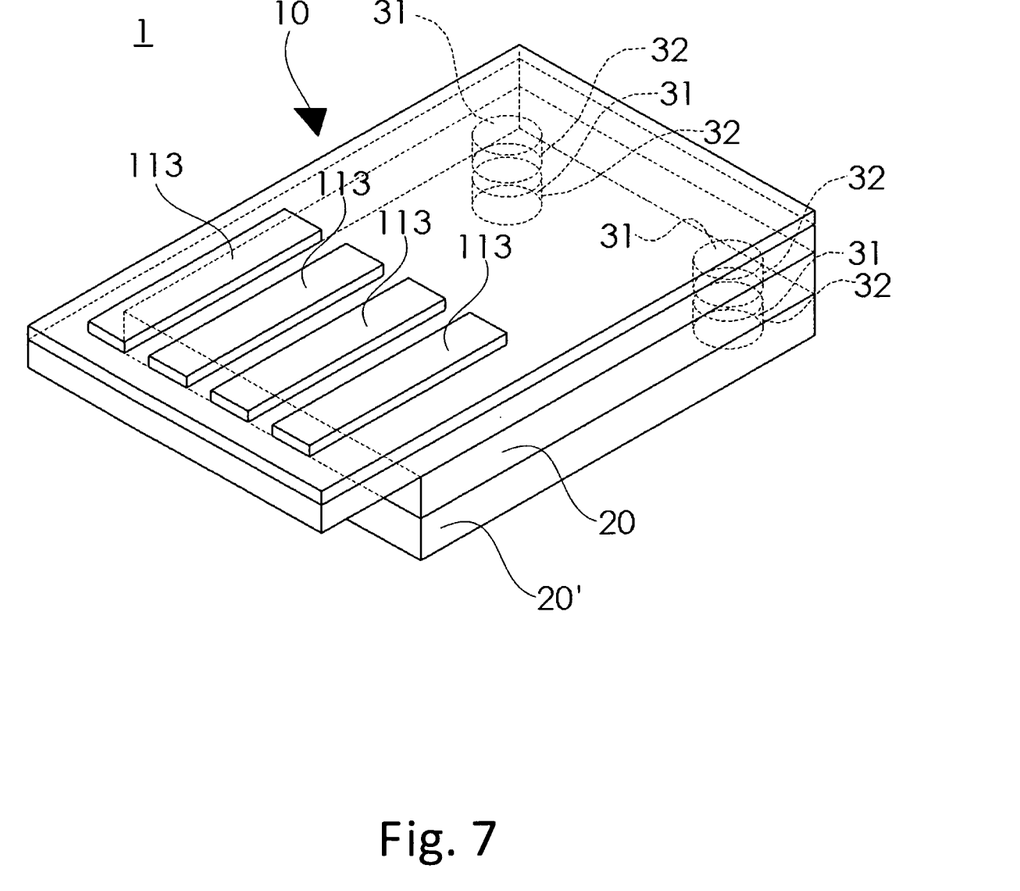
FIG. 7 is a perspective view of the USB device structure in FIG. 6.

With reference to FIGS. 6 and 7, a second embodiment of a USB device structure in accordance with the present invention is shown. The structural characteristics in FIGS. 6 and 7 that are identical to those in the first embodiment illustrated in FIGS. 3 to 5 are marked with the same reference numbers and omitted without further description. The second embodiment differs from the first embodiment in a standard height of a data transmission interface of a male connector achieved by stacking multiple support elements 20. When the standard height is achieved, a protrusion 31 and a recess 32 are correspondingly formed between the memory module 10 and a support element 20 or between the support element 20 and another support element 20'. Hence, the positions at which the protrusions 31 and the recesses 32 are formed should not be limited except that the positions at which the protrusions 31 and the recesses 32 are correspondingly formed. In other words, when a protrusion 31 (or a recess 32) is formed in an outer surface of the memory module 10 (the protrusion is formed in an outer surface of the package 14 of the memory module 10 in the present embodiment), a recess 32 (or a protrusion 31) is correspondingly formed on and protrudes from an outer surface of the support element 20; when a protrusion 31 (or a recess 32) is formed on and protrudes from the outer surface of the support element 20, a recess 32 (or a protrusion 31) is correspondingly formed in an outer surface of another support element 20', so that the combined structure (a memory module and multiple support elements) can be firmly stacked.

Figure 8:
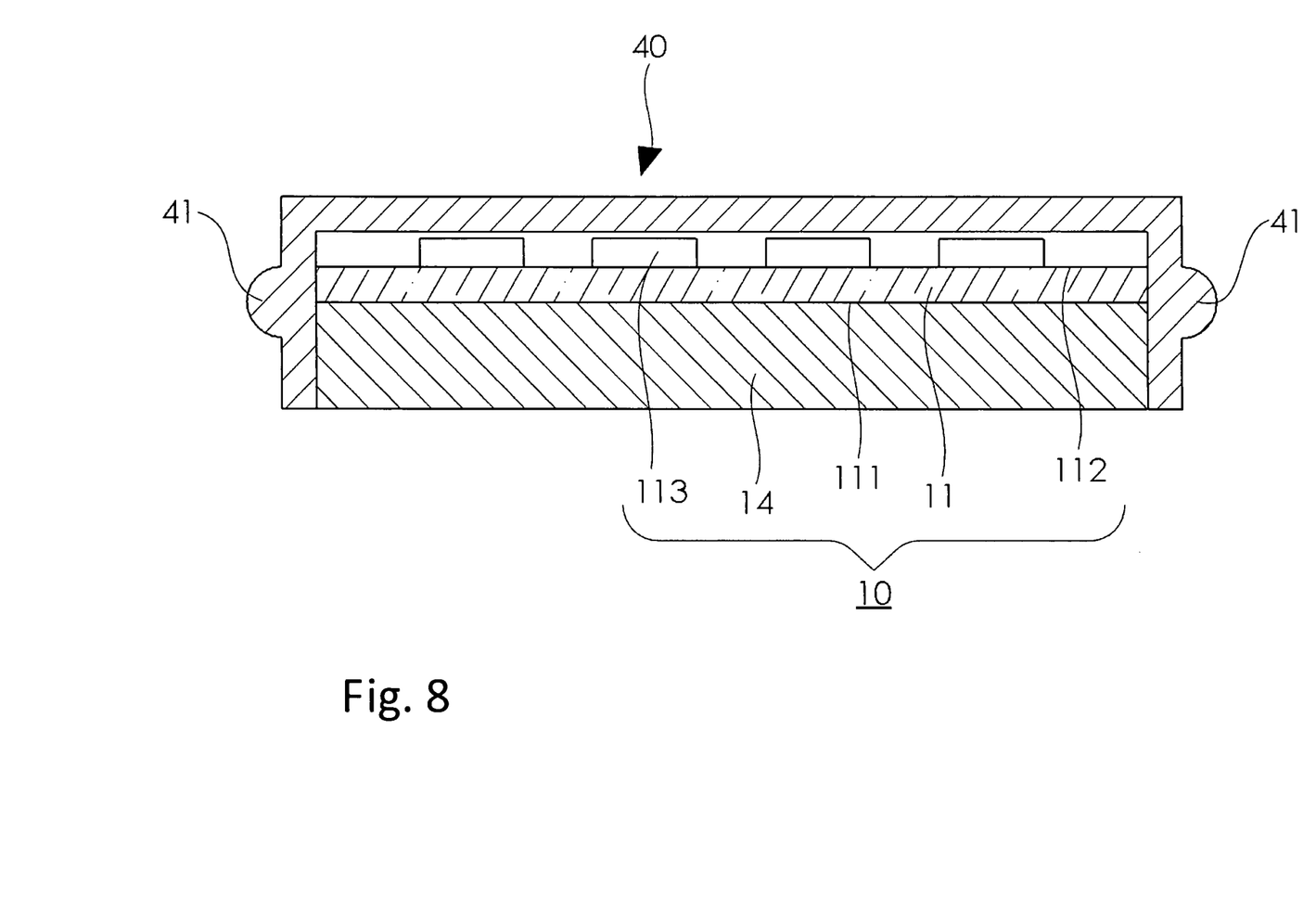
FIG. 8 is a side view in partial section of a third embodiment of a USB device structure in accordance with the present invention.
Figure 9:
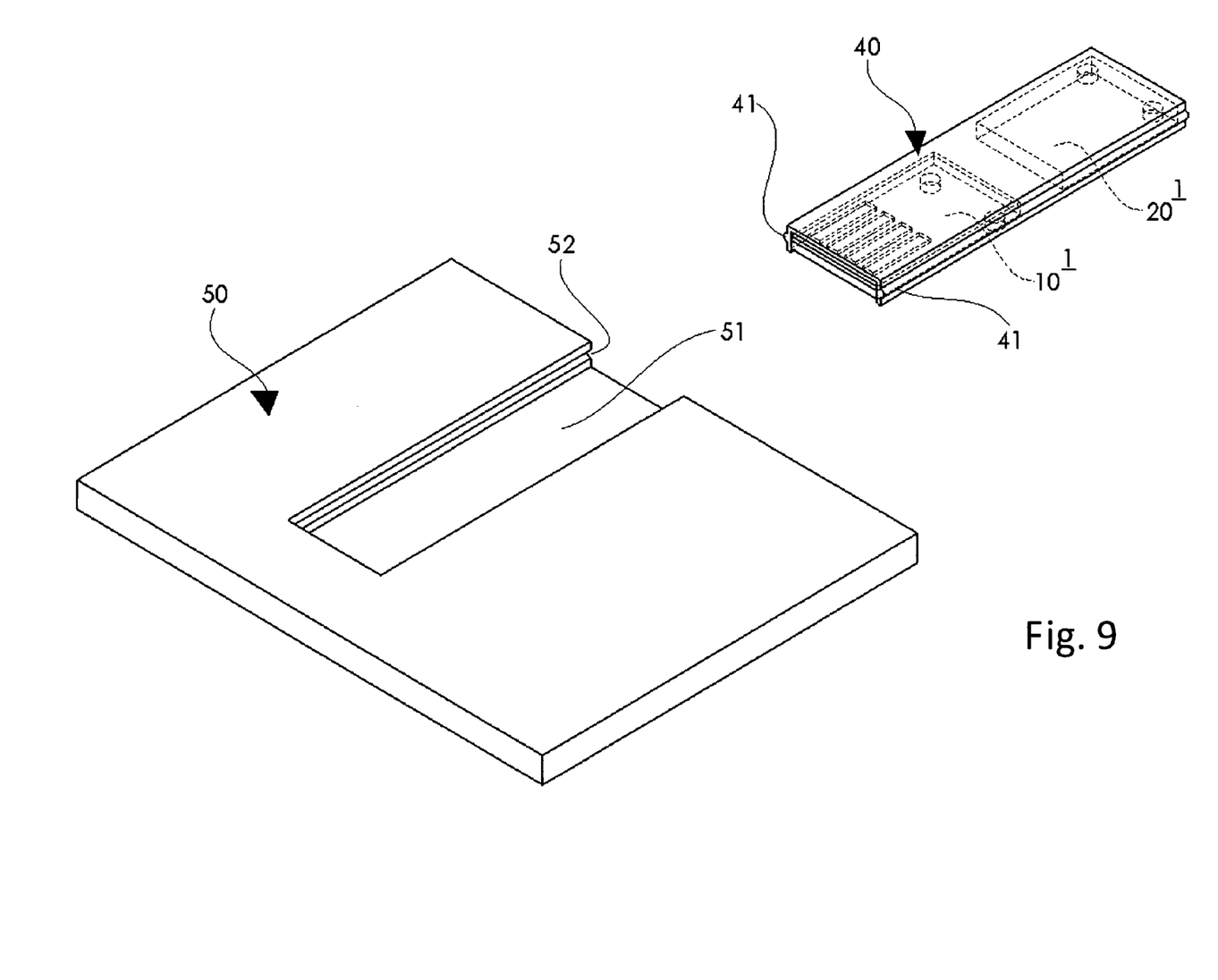
FIG. 9 is an exploded perspective view of the USB device structure in FIG. 8.

With reference to FIGS. 8 and 9, a third embodiment of a USB device structure in accordance with the present invention is shown. The structural characteristics in FIGS. 8 and 9 that are identical to those in the first embodiment illustrated in FIGS. 3 to 5 are marked with the same reference numbers and omitted without further description.

The third embodiment differs from the first embodiment in that the memory module 10 and the support element 20 are mounted inside a housing 40. Preferably, the housing 40 may be mounted in a bearing slot 51 of a bearer 50. The bearer 50 may be but not limited to a credit card, a debit card, a personal ID card, a business card and the like.

Additionally, the housing 40 may have at least one rib 41. Each of the at least one rib 41 is longitudinally formed across a corresponding outer surface of the housing 40. The bearer 50 has at least one channel 52. Each of the at least one channel 52 is formed in a corresponding inner wall of the bearing slot 51 of the bearer 50 so that each of the at least one rib 41 of the housing is mounted in a corresponding channel 52 of the bearing slot 51 of the bearer 50. Preferably, each of the at least one rib 41 and the at least one channel 52 may take a form being narrow outside and wide inside (not shown) so that the housing 40 can be mounted in the bearer 50 without easily coming off. Preferably, the housing 40 and the bearer 50 may be but not limited to be made of plastic, paper board, metal or a combination thereof.

Regardless of the first embodiment, the second embodiment and the third embodiment, they are not intended for limitation of the present invention. All changes and modifications of the specification and drawings conducted by anyone who is skilled the technique of the present invention based on the foregoing embodiments without departing from the spirit of the present invention still fall within the technical scope protected by the present invention. Accordingly, as to the protection scope of the present invention, the appended claims prevail.

The present invention provides a USB device structure having a memory module and at least one support element. A combined thickness of the memory module and the support element complies with a height of a male connector having at least one of USB, Mini USB, Micro USB and e-SATA data transmission interface so that the present invention can effectively reduce the thickness of a USB device structure, extensively serves to advertise and promote, and enhances to be properly received.

Accordingly, due to the difference from the conventional USB device structure and novelty among all types of similar structures, the present invention is patentable and an application thereof is filed pursuant to the patent laws.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A USB device structure comprising:
   at least one support element;
   a memory module having:
      a substrate having:
         an inner surface;
         an outer surface; and
         multiple metal contacts mounted on the outer surface;
      at least one memory chip mounted on the inner surface of the substrate;
      wherein an outer surface of the memory module comprises at least one protrusion or recess, and an outer surface of the support element comprises at least one recess or protrusion, wherein each of the at least one protrusion or recess of the memory module corresponds to and engages a corresponding recess or protrusion so that the memory module can be firmly stacked on the support element;
   at least one control component mounted on the inner surface of the substrate;
   wherein, a combined thickness of the memory module and the support element complies with a height of a male connector having at least one data transmission interface of USB, Mini USB, Micro USB and e-SATA.

2. The USB device structure as claimed in claim 1, wherein the USB device structure comprises one support element, the memory module has at least one protrusion formed on and protruding from an outer surface of the memory module, the support element has at least one recess formed in a corresponding outer surface of the support element, and each of the at least one protrusion of the memory module corresponds to and engages a corresponding recess of the support element.

3. The USB device structure as claimed in claim 1, wherein the USB device structure comprises one support element, the memory module has at least one recess formed in an outer surface of the memory module, the support element has at least one protrusion formed on and protruding from a corresponding outer surface of the support element, and each of the at least one recess of the memory module corresponds to and engages a corresponding protrusion of the support element.

4. The USB device structure as claimed in claim 1, wherein the USB device structure comprises one support element, and further comprises an adhesive layer mounted between an outer surface of the memory module and a corresponding surface of the support element to bond the memory module with the support element.

5. The USB device structure as claimed in claim 1, the USB device structure comprises one support element, and further comprises magnetic materials respectively mounted on an outer surface of the memory module and on a corresponding outer surface of the support element to attract the memory module and the support element together.

6. The USB device structure as claimed in claim 1, wherein a thickness of the memory module is no larger than 1.3 mm.

7. The USB device structure as claimed in claim 1, wherein the memory module further has a package formed on the inner surface of the substrate for packaging the at least one memory chip and the at least one control chip in the package.

8. The USB device structure as claimed in claim 1, wherein the metal contacts are compatible with at least one of USB, Mini USB, Micro USB and e-SATA data transmission interfaces of a male connector.

9. The USB device structure as claimed in claim 1, further comprising a housing, wherein the memory module and the support element are mounted in the housing.

10. The USB device structure as claimed in claim 9, further comprising a bearer having a bearer slot, wherein the housing is mounted in the bearer slot of the bearer.

11. The USB device structure as claimed in claim 10, wherein the housing has at least one rib, each of the at least one rib is longitudinally formed across a corresponding outer surface of the housing, the bearer has at least one channel, and each of the at least one channel is formed in a corresponding inner wall of the bearing slot of the bearer so that each of the at least one rib of the housing is mounted in a corresponding channel of the bearing slot of the bearer.

12. The USB device structure as claimed in claim 10, wherein the housing and the bearer are made of plastic, paper board, metal, and a combination of plastic, paper board and metal.

* * * * *